(12) United States Patent
Tan et al.

(10) Patent No.: US 9,396,813 B2
(45) Date of Patent: Jul. 19, 2016

(54) SHIFT REGISTER CELL, SHIFT REGISTER, GATE DRIVER AND DISPLAY PANEL

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Wen Tan, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 109 days.

(21) Appl. No.: 14/379,091

(22) PCT Filed: Dec. 5, 2013

(86) PCT No.: PCT/CN2013/088662
§ 371 (c)(1),
(2) Date: Aug. 15, 2014

(87) PCT Pub. No.: WO2015/018149
PCT Pub. Date: Feb. 12, 2015

(65) Prior Publication Data
US 2015/0294733 A1 Oct. 15, 2015

(30) Foreign Application Priority Data
Sep. 8, 2013 (CN) .......................... 2013 1 0346888

(51) Int. Cl.
G11C 19/18 (2006.01)
G09G 3/20 (2006.01)
G11C 19/28 (2006.01)

(52) U.S. Cl.
CPC .............. *G11C 19/184* (2013.01); *G09G 3/20* (2013.01); *G11C 19/28* (2013.01); *G09G 2310/0286* (2013.01)

(58) Field of Classification Search
CPC ........ G11C 19/28; G11C 19/184; G09G 3/20; G09G 2310/0286
See application file for complete search history.

(56) References Cited

U.S. PATENT DOCUMENTS

2009/0167741 A1 7/2009 Tsai
2013/0027378 A1 1/2013 Lee et al.

FOREIGN PATENT DOCUMENTS

CN 101546607 A 9/2009
CN 101556831 A * 10/2009
(Continued)

OTHER PUBLICATIONS

International Search Report issued in International Application No. PCT/CN2013/088662, fourteen (14) pages.
(Continued)

*Primary Examiner* — Amare Mengistu
*Assistant Examiner* — Jennifer Zubajlo
(74) *Attorney, Agent, or Firm* — Nath, Goldberg & Meyer; Joshua B. Goldberg

(57) ABSTRACT

A shift register cell comprising a first drive signal input terminal, a first drive signal output terminal, a first clock signal input terminal, a first pull-up transistor, a first output pull-down transistor, a switch transistor, a reset transistor and a bootstrap capacitor, wherein the shift register cell further comprises a pull-down unit, wherein a first terminal of the pull-down unit is connected with a gate of the switch transistor, a second terminal of the pull-down unit is connected with a gate of the reset transistor, a third terminal of the pull-down unit is connected with a gate of the first output pull-down transistor, a source of the reset transistor is connected with a second low level input terminal, and a source of the first output pull-down transistor is connected with a third low level input terminal. Depletion type transistors may be applied to above shift register cell.

16 Claims, 6 Drawing Sheets

(56) References Cited

FOREIGN PATENT DOCUMENTS

| CN | 101556831 B | 10/2009 |
| CN | 101645308 A | 2/2010 |
| CN | 102651186 A | 8/2012 |
| CN | 102867475 A | 1/2013 |
| CN | 103035218 A | 4/2013 |
| CN | 103198783 A | 7/2013 |
| CN | 103258495 A | 8/2013 |
| CN | 203422915 U | 2/2014 |
| TW | 200929131 A | 7/2009 |

OTHER PUBLICATIONS

Notification of the First Office Action dated May 19, 2015 corresponding to Chinese application No. 201310346888.X.

* cited by examiner

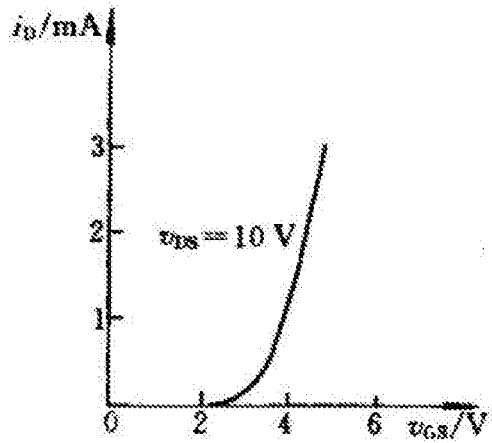
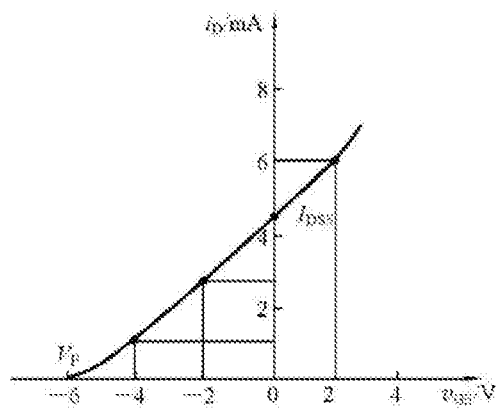
Fig. 3 (Prior Art)  Fig. 4 (Prior Art)
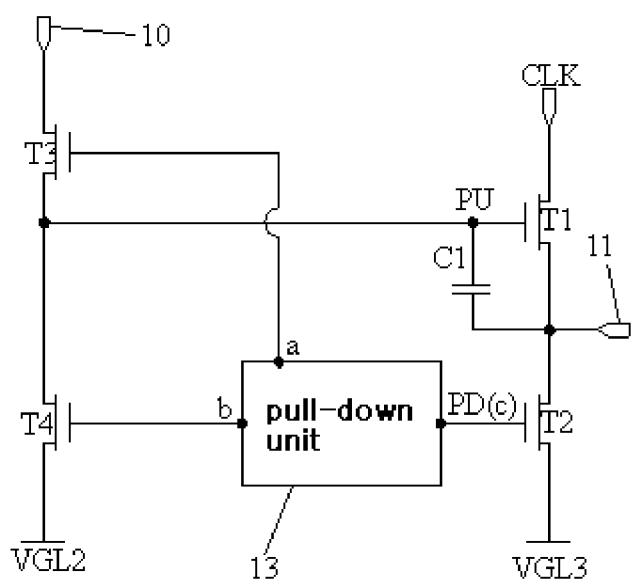
Fig. 5

SHIFT REGISTER CELL, SHIFT REGISTER, GATE DRIVER AND DISPLAY PANEL

This is a National Phase Application filed under 35 U.S.C. 371 as a national stage of PCT/CN2013/088662, filed Dec. 5, 2013, and claims priority benefit from Chinese Application No. 201310346888.X, filed Aug. 9, 2013, the content of each of which is hereby incorporated by reference in its entirety.

TECHNICAL FIELD

The present invention relates to the field of display technology, and particularly, to a shift register cell, a shift register comprising the shift register cell, and a display panel comprising the shift register.

BACKGROUND ART

With development of panel display, high resolution and narrow border become trends of development, and integrating a gate drive circuit on a display panel is the most important solution to achieve high resolution and narrow border.

FIG. 1 shows a circuit diagram of a basic shift register cell used for a gate drive circuit in the prior art. As shown in FIG. 1, the basic shift register cell comprises a pull-up transistor T100, an output pull-down transistor T200, a bootstrap capacitor C1, a pull-up control transistor T300, a pull-down control transistor T400, a pull-down unit 13, a first clock signal input terminal CLK, a drive signal input terminal OUT(n−1) and a drive signal output terminal OUT(n).

In FIG. 1, a pull-up node PU is a node connected with a gate of the pull-up transistor T100, a pull-down node PD is a node connected with a gate of the output pull-down transistor T200, and a start signal STV is inputted from the drive signal input terminal OUT(n−1).

FIG. 2 shows a timing diagram of signals during operation of the shift register cell in FIG. 1, wherein VGL represents a low level, and VGH represents a high level.

As shown in FIG. 2, when enhanced thin film transistors (TFTs) are used for implementing the basic shift register cell shown in FIG. 1, the basic shift register cell may operate normally (as indicated by solid line in FIG. 2), wherein the enhanced TFTs may be thin film transistors made of amorphous silicon (a-Si) or polycrystalline silicon (p-Si).

However, when depletion type TFTs are used for implementing the basic shift register cell shown in FIG. 1, as a threshold voltage of a depletion type TFT is less than zero (0), the basic shift register cell may not operate normally (as indicated by dash line in FIG. 2).

FIG. 3 and FIG. 4 show difference between an enhanced thin film transistor and a depletion type thin film transistor. Specifically, FIG. 3 shows a characteristic graph of an enhanced thin film transistor, wherein a vertical axis represents a drain current ($i_D$) of the thin film transistor, and a lateral axis represents a gate-source voltage ($V_{GS}$). It can be seen from FIG. 3, when $V_{GS}$ is 0, $i_D$ is 0, that is, with respect to an enhanced thin film transistor, when $V_{GS}$ is 0, the enhanced thin film transistor is turned off completely. FIG. 4 shows a characteristic graph of a depletion type thin film transistor, wherein a vertical axis represents a drain current ($i_D$), and a lateral axis represents a gate-source voltage ($V_{GS}$). However, It can be seen from FIG. 4, when $V_{GS}$ is 0, $i_D$ is far larger than 0, and only when $V_{GS}$ is a certain negative voltage, $i_D$ is 0.

However, in recent years, more and more attentions have been given to oxide thin film transistors with characteristic of depletion, which are considered as a semiconductor technology with great potential. Compared with a p-Si thin film transistor, fabrication process of an oxide thin film transistor is simpler, and cost of the oxide thin film transistor is lower. Compared with an a-Si thin film transistor, mobility of an oxide thin film transistor is higher. Thus, in future, oxide thin film transistors may very likely to be used as a mainstream backplane drive technique for various display panels (in particular, organic light emitting diode (OLED) and flexible display panels).

Therefore, there is a need to provide a shift register cell which may be implemented by depletion type TFTs.

SUMMARY

In view of above, an objective of the present invention is to provide a shift register cell, a shift register comprising the shift register cell, a gate driver comprising the shift register cell and a display panel comprising the gate driver, wherein depletion type thin film transistors may be used in the shift register cell.

To achieve the above objective, an aspect of the present invention provides a shift register cell. The shift register cell comprises a first drive signal input terminal, a first drive signal output terminal, a first clock signal input terminal, a first pull-up transistor, a first output pull-down transistor, a switch transistor, a reset transistor and a bootstrap capacitor, wherein a drain of the switch transistor is connected with the first drive signal input terminal, a drain of the first output pull-down transistor is connected with the first drive signal output terminal, one terminal of the bootstrap capacitor is connected with a gate of the first pull-up transistor, the other terminal of the bootstrap capacitor is connected with the first drive signal output terminal, the gate of the first pull-up transistor is connected with a source of the switch transistor, a drain of the first pull-up transistor is connected with the first clock signal input terminal, the drain of the first pull-up transistor is connected with the first drive signal output terminal, and a drain of the reset transistor is connected with the source of the switch transistor. The shift register cell further comprises a pull-down unit, wherein a first terminal of the pull-down unit is connected with a gate of the switch transistor, a second terminal of the pull-down unit is connected with a gate of the reset transistor, a third terminal of the pull-down unit is connected with a gate of the first output pull-down transistor, a source of the reset transistor is connected with a second low level input terminal capable of outputting a second low level and a source of the first output pull-down transistor is connected with a third low level input terminal capable of outputting a third low level. During an evaluation stage, the pull-down unit may output a first low level to the gate of the first output pull-down transistor, the gate of the switch transistor and the gate of the reset transistor, wherein difference between the first low level and the second low level is less than threshold voltage of the reset transistor, and difference between the first low level and the third low level is less than threshold voltage of the first output pull-down transistor.

For example, the pull-down unit comprises a first pull-down module and a second pull-down module. The first pull-down module is used for outputting the second low level to the second terminal and the third terminal during a pre-charging stage, wherein difference between the second low level and the third low level is less than threshold voltage of the first output pull-down transistor. The second pull-down module is used for outputting the first low level to the second terminal and the third terminal during the evaluation stage.

For example, the shift register cell comprises a second drive signal output terminal, which is synchronous with the first drive signal output terminal, and is capable of outputting a high level or the first low level. The second pull-down module comprises a first pull-down control transistor and a second drive signal input terminal, wherein a gate of the first pull-down control transistor is connected with the second drive signal output terminal, a source of the first pull-down control transistor is connected with the first low level input terminal a drain of the first pull-down control transistor is connected with the second terminal and the third terminal. The second drive signal input terminal is synchronous with the first drive signal input terminal, is capable of being inputted a high level and the first low level, and is connected with the first terminal.

For example, the second pull-down module further comprises a second pull-down control transistor, wherein a gate of the second pull-down control transistor is connected with the second drive signal output terminal, a source of the second pull-down control transistor is connected with the first low level input terminal, and a drain of the second pull-down control transistor is connected with the first terminal.

For example, the shift register cell further comprises a second drive signal output module comprising a second pull-up transistor and a second output pull-down transistor, wherein a gate of the second pull-up transistor is connected with the gate of the first pull-up transistor, a drain of the second pull-up transistor is connected with the first clock signal input terminal, a source of the second pull-up transistor is connected with the second drive signal output terminal, a gate of the second output pull-down transistor is connected with the gate of the first output pull-down transistor, a source of the second output pull-down transistor is connected with the first low level input terminal, and a drain of the second output pull-down transistor is connected with the second drive signal output terminal.

For example, the shift register cell further comprises a second clock signal input terminal, which is opposite from the first clock signal input terminal. The first pull-down module comprises a third pull-down control transistor and a fourth pull-down control transistor, wherein the resistance of the fourth pull-down control transistor is less than the resistance of the third pull-down control transistor, a gate and a drain of the third pull-down control transistor are connected with the second clock signal input terminal, a source of the third pull-down control transistor is connected with the second terminal, a gate of the fourth pull-down control transistor is connected with the second drive signal input terminal, a source of the fourth pull-down control transistor is connected with the second low level input terminal, a drain of the fourth pull-down control transistor is connected with the second terminal, and the second terminal is also connected with the third terminal.

For example, the shift register cell further comprises a second clock signal input terminal, which is opposite from the first clock signal input terminal. The first pull-down module comprises a third pull-down control transistor, a fourth pull-down control transistor, a fifth pull-down control transistor and a sixth pull-down control transistor, wherein the resistance of the fourth pull-down control transistor is less than the resistance of the third pull-down control transistor, the resistance of the sixth pull-down control transistor is less than the resistance of the fifth pull-down control transistor, a gate and a drain of the third pull-down control transistor are connected with the second clock signal input terminal a source of the third pull-down control transistor is connected with a drain of the fourth pull-down control transistor, a gate of the fourth pull-down control transistor is connected with the second drive signal input terminal, a source of the fourth pull-down control transistor is connected with the second low level input terminal, a drain of the fifth pull-down control transistor is connected with the second clock signal input terminal, a gate of the fifth pull-down control transistor is connected with the drain of the fourth pull-down control transistor, a source of the fifth pull-down control transistor is connected with the second terminal, a mate of the sixth pull-down control transistor is connected with the second drive signal input terminal, a source of the sixth pull-down control transistor is connected with the second low level input terminal, a drain of the sixth pull-down control transistor is connected with the second terminal, and the second terminal is also connected with the third terminal.

For example, the shift register cell further comprises a second clock signal input terminal, which is opposite from the first clock signal input terminal. The first pull-down module comprises a seventh pull-down control transistor and a pull-down capacitor, wherein the resistance of the pull-down capacitor is larger than the resistance of the seventh pull-down control transistor, one terminal of the pull-down capacitor is connected with the second clock signal input terminal, the other terminal of the pull-down capacitor is connected with the second terminal, a gate of the seventh pull-down control transistor is connected with the second drive signal input terminal, a source of the seventh pull-down control transistor is connected with the second low level input terminal, a drain of the seventh pull-down control transistor is connected with the second terminal, and the second terminal is also connected with the third terminal.

For example, at least one of the first pull-up transistor, the first output pull-down transistor, the switch transistor and the reset transistor is a depletion type transistor.

For example, all of the first pull-up transistor, the first output pull-down transistor, the switch transistor and the reset transistor are N-channel thin film transistors.

Another aspect of the present invention provides a shift register comprising multiple stages of shift register cells, each of which is the above register cell provided by the present invention, wherein the first drive signal input terminal of the shift register cell in a post-stage is connected with the first drive signal output terminal of the shift register cell in an previous-stage.

Another aspect of the present invention further provides a gate driver comprising above shift register.

Still another aspect of the present invention provides a display panel. The display panel comprises thin film transistors, data lines, gate lines and a gate driver electrically connected with the gate lines, wherein the gate driver is above gate driver provided by the present invention, and a first drive signal output terminal of a shift register cell in a shift register of the gate driver is connected with the gate line.

In the shift register cell of the present invention, during an evaluation stage, the potential of the mate of the first output pull-down transistor is the first low level, and the potential of the source of the first output pull-down transistor is the third low level thus the first output pull-down transistor is completely turned off during the evaluation stage; the potential of the source of the reset transistor is the second low level, and the potential of the gate of the reset transistor is the first low level, thus the reset transistor is completely turned off; the potential of the source of the switch transistor is the same as that of the pull-up node (i.e., higher than the high level), and the potential of the gate of the switch transistor is the first low level, thus the switch transistor is also completely tuned off.

Even if all of the first output pull-down transistor the switch transistor and the reset transistor are depletion type transistors, during the evaluation stage, the first output pull-down transistor, the switch transistor and the reset transistor are completely turned off and will not produce a leakage current, thus the pull-up node will be coupled to a high potential.

BRIEF DESCRIPTION OF THE DRAWINGS

Drawings constitute a part of the specification, and are used for further explaining the invention in connection with the following embodiments, but the invention is not limited thereto. In the Drawings:

FIG. 3 is a characteristic graph of an enhanced transistor;

FIG. 4 is a characteristic graph of a depletion type transistor;

FIG. 5 is a principle diagram of a shift register cell of the present invention;

Figure 1:
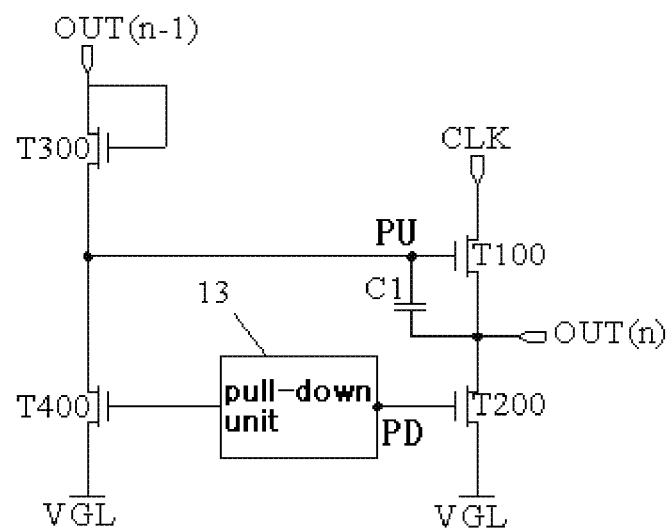
FIG. 1 is a circuit diagram of a basic shift register cell in the prior art.
Figure 2:
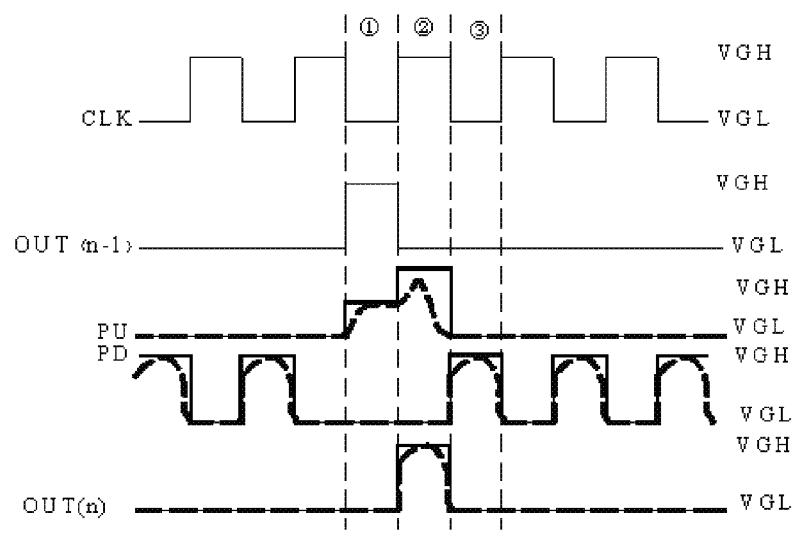
FIG. 2 is a timing diagram of signals of the shift register cell shown in FIG. 1 during operation.

| Reference signs: | |
|---|---|
| T1: first pull-up transistor | T2: first output pull-down transistor |
| T3: switch transistor | T4: reset transistor |
| T5: second pull-up transistor | T6: second output pull-down transistor |
| T7: third pull-down control transistor | T8: fourth pull-down control transistor |
| T9: second pull-down control transistor | T10: first pull-down control transistor |
| T11: fifth pull-down control transistor | T12: sixth pull-down control transistor |
| T13: seventh pull-down control transistor | C1: bootstrap capacitor |
| C2: pull-down capacitor | CLK: first clock signal input terminal |
| CLKB: second clock signal input terminal | 10: first drive signal input terminal |
| 11: first drive signal output terminal | 12: second drive signal output terminal |
| 13: pull-down unit | 14: second drive signal input terminal |
| 13a: first pull-down module | 13b: second pull-down module |
| 15: second drive signal output module | VGH: high level |
| VGL: low level | VGL1: first low level |

DETAILED DESCRIPTION OF THE PREFERRED EMBODIMENTS

Specific embodiments of the present invention will be described below in detail with reference to the drawings. It should be understood that, the specific embodiments described here are only used for clarifying or explaining the invention, but the invention is not limited thereto.

FIG. 5 is a principle diagram of a shift register cell of the present invention. As shown in FIG. 5, the shift register cell comprises a first drive signal input terminal 10, a first drive signal output terminal 11, a first clock signal input terminal CLK, a first pull-up transistor T1, a first output pull-down transistor T2, a switch transistor T3, a reset transistor T4 and a bootstrap capacitor C1, wherein a drain of the switch transistor T3 is connected with the first drive signal input terminal 10, a drain of the first output pull-down transistor T2 is connected with the first drive signal output terminal 11, one terminal of the bootstrap capacitor C1 is connected with a gate of the first pull-up transistor T1, the other terminal of the bootstrap capacitor C1 is connected with the first drive signal output terminal 11, the gate of the first pull-up transistor T1 is connected with a source of the switch transistor T3, a drain of the first pull-up transistor T1 is connected with the first clock signal input terminal CLK, a source of the first pull-up transistor T1 is connected with the first drive signal output terminal 11, a drain of the reset transistor T4 is connected with the source of the switch transistor T3. The shift register cell further comprises a pull-down unit 13, wherein a first terminal a of the pull-down unit 13 is connected with a gate of the switch transistor T3, a second terminal b of the pull-down unit 13 is connected with a gate of the reset transistor T4, a third terminal c of the pull-down unit 13 is connected with a gate of the first output pull-down transistor T2, a source of the reset transistor T4 is connected with a second low level input terminal capable of outputting a second low level VGL2, a source of the first output pull-down transistor T2 is connected with a third low level input terminal capable of outputting a third low level VGL3. During an evaluation stage, the pull-down unit 13 can output a first low level VGL1 to the gate of the first output pull-down transistor T2, the gate of the switch transistor T3 and the gate of the reset transistor T4, wherein difference between the first low level VGL1 and the second low level VGL2 is less than threshold voltage of the reset transistor T4 (that is, $VGL1-VGL2<V_{th,T4}$), difference between the first low level VGL1 and the third low level VGL3 is less than threshold voltage of the first output pull-down transistor T2 (that is, $VGL1-VGL3<V_{th,T2}$).

It should be understood that, the gate of the first pull-up transistor T1 functions as a pull-up node PU, the gate of the first output pull-down transistor T2 functions as a pull-down node PD, and the pull-down node PD is coincident with the third terminal c of the pull-down unit 13 (see from FIG. 6 to FIG. 9).

During the evaluation stage (i.e., stage② in FIG. 10), the potential of the gate of the first output pull-down transistor T2 is the first low level VGL1, and the potential of the source of the first output pull-down transistor T2 is the third low level VGL3, thus the first pull-down transistor T2 is completely turned off during the evaluation stage; the potential of the source of the reset transistor T4 is the second low level VGL2, and the potential of the gate of the reset transistor T4 is the first low level VGL1, thus the reset transistor T4 is completely turned off; the potential of the source of the switch transistor T3 is the same as that of the pull-up node PU (i.e., higher than a high level VGH), and the potential of the gate of the switch transistor T3 is the first low level VGL1, thus the switch transistor T3 is also completely turned off.

Even if all of the first output pull-down transistor T2, the switch transistor T3 and the reset transistor T4 are depletion type transistors, during the evaluation stage, the first output pull-down transistor T2, the switch transistor T3 and the reset transistor T4 are also completely turned off and will not produce a leakage current, thus the pull-up node will be coupled to a high potential, so that the first pull-up transistor T1 is turned on, and the first drive signal output terminal outputs the high level VGH.

It should be understood that, during a pre-charging stage (i.e., stage①in FIG. 10), the first terminal a of the pull-down unit 13 should output a high level to the gate of the switch transistor T3, so that the switch transistor T3 is turned on and the pull-up node PU is charged. Moreover, during the pre-charging stage, the reset transistor T4 and the first output pull-down transistor T2 should be substantially turned off, so that the pre-charging stage is in normal.

It also should be understood that, during a reset stage, the second terminal b of the pull-down unit 13 should output the high level VGH to the gate of the reset transistor T4, so that the reset transistor T4 is turned on, and the pull-up node PU is discharged.

Specific structure of the pull-down unit 13 will be described below in connection with FIG. 6 to FIG. 9.

As shown in FIG. 6 to FIG. 9, the pull-down unit may comprise a first pull-down module 13a and a second pull-down module 13b. The first pull-down module 13a is used for outputting the second low level VGL2 to the second terminal b and the third terminal c of the pull-down unit during the pre-charging stage (i.e., stage①in FIG. 10), and difference between the second low level VGL2 and the third low level VGL3 is less than threshold voltage $V_{th,T2}$ of the first output pull-down transistor T2 (that is, $VGL2-VGL3<V_{th,T2}$). The second pull-down module 13b is used for outputting the first low level VGL1 to the first terminal a, the second terminal b and the third terminal c of the pull-down unit during the evaluation stage.

During the pre-charging stage, the first output pull-down transistor T2 is completely turned off, and the reset transistor T4 is substantially turned off, thus the pull-up node PU can be charged normally.

More specifically, in order to make the second pull-down module 13b output the first low level VGL1 to the first terminal a, the second terminal b and the third terminal c of the pull-down unit during the evaluation stage, as shown in FIG. 6 to FIG. 9, the shift register cell may further comprise a second drive signal output terminal 12, which is synchronous with the first drive signal output terminal 11 and is capable of outputting the high level VGH and the first low level VGL1. The second pull-down module 13b may comprise a first pull-down control transistor T10 and a second drive signal input terminal 14, wherein a gate of the first pull-down control transistor T10 is connected with the second drive signal output terminal 12, a source of the first pull-down control transistor T10 is connected with the first low level input terminal, a drain of the first pull-down control transistor T10 is connected with the second terminal b and the third terminal c of the pull-down unit, the second drive signal input terminal 14 is connected with the first terminal a of the pull-down unit, is synchronous with the first drive signal input terminal 10, and is capable of inputting the high level VGH and the first low level VGL1 to the first terminal a.

The second drive signal input terminal 14 being synchronous with the first drive signal input terminal 10 means that, when the high level VGH is inputted to the drain of the switch transistor T3 by the first drive signal input terminal 10, the high level VGH is inputted to the gate of the switch transistor T3 by the second drive signal input terminal 14, and when a low level is inputted to the drain of the switch transistor T3 by the first drive signal input terminal 10, the first low level VGL1 is inputted to the gate of the switch transistor T3 by the second drive signal input terminal 14.

With the second drive signal input terminal 14, it can ensure that the switch transistor T3 is turned on during the pre-charging stage and is turned off during the evaluation stage.

The second drive signal output terminal 12 being synchronous with the first drive signal output terminal 11 means that, when the first drive signal output terminal 11 outputs a high level, the second drive signal output terminal 12 also outputs a high level, and when the first drive signal output terminal 11 outputs a low level, the second drive signal output terminal 12 also outputs a low level. The first drive signal output terminal 11 outputs the high level VGH only during the evaluation stage, thus the second drive signal output terminal 12 also outputs the high level VGH only during the evaluation stage.

During the evaluation stage, the gate of the first pull-down control transistor T10 is at the high level VGH output from the second drive signal output terminal 12, thus the first pull-down control transistor T10 is turned on, and the potential of the drain of the first pull-down control transistor T10 is the first low level VGL1, so that the second terminal b and the third terminal c of the pull-down unit can be pulled down to the first low level VGL1.

In order to ensure the switch transistor T3 being turned off during the evaluation stage, for example, the second pull-down module 13b may further comprise a second pull-down control transistor T9, wherein a gate of the second pull-down control transistor T9 is connected with the second drive signal output terminal 12, a source of the second pull-down control transistor T9 is connected with the first low level input terminal, and a drain of the second pull-down control transistor T9 is connected with the first terminal a of the pull-down unit.

During the evaluation stage, the second drive signal output terminal 12 outputs a high level to the gate of the second pull-down control transistor T9, so that the second pull-down control transistor T9 is turned on, and the potential of the first terminal a of the pull-down unit will be pulled down to the first low level VGL1.

How to output a second drive signal in synchronous with a first drive signal by the second drive signal output terminal 12 will be described below.

Figure 6:
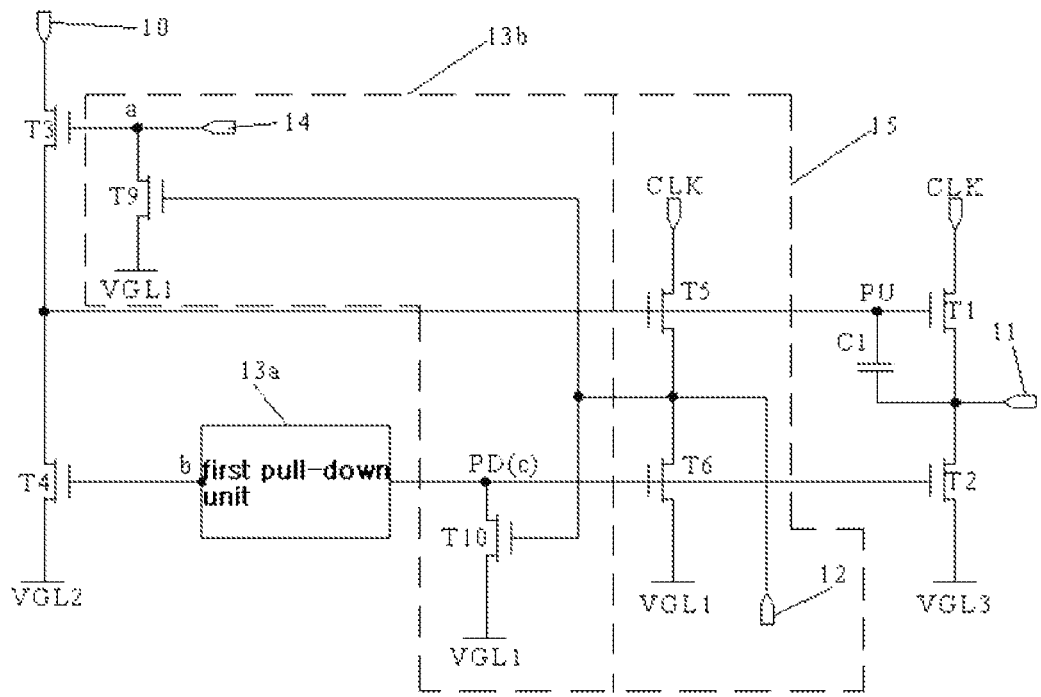
FIG. 6 is a circuit diagram of a first embodiment of the shift register cell of the present invention.
Figure 7:
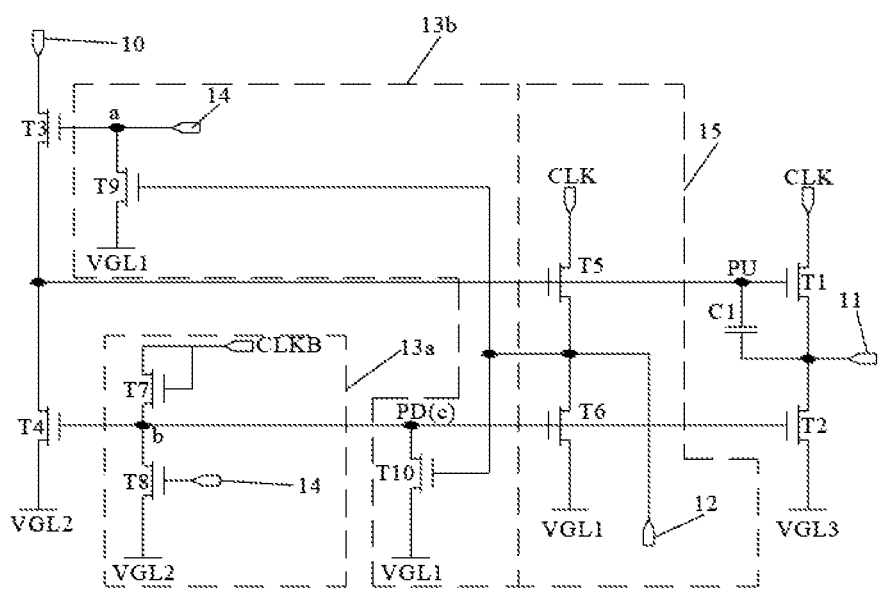
FIG. 7 is a circuit diagram of a second embodiment of the shift register cell of the present invention.

As shown in FIG. 6 and FIG. 7, the shift register cell further comprises a second drive signal output module 15. The second drive signal output module 15 comprises a second pull-up transistor T5 and a second output pull-down transistor T6, wherein a gate of the second pull-up transistor T5 is connected with the gate (the pull-up node PU) of the first pull-up transistor T1, a drain of the second pull-up transistor T5 is connected with the first clock signal input terminal CLK, a source of the second pull-up transistor T5 is connected with the second drive signal output terminal 12, a gate of the second output pull-down transistor T6 is connected with the gate (the pull-down node PD) of the first output pull-down transistor T2, a source of the second output pull-down transistor T6 is connected with the first low level input terminal, a drain of the second output pull-down transistor T6 is connected with the second drive signal output terminal 12.

As above, the gate of the second pull-up transistor T5 is connected with the pull-up node PU, and the gate of the second output pull-down transistor T6 is connected with the pull-down node PD, thus during the evaluation stage, the second drive signal output terminal 12 can output the high level VGH, and during the pre-charging stage, the reset stage and a non-operation stage, the second drive signal output terminal 12 can output the first low level VGL1. Therefore, during the pre-charging stage, the reset stage and the non-operation stage, the first pull-down control transistor T10 and the second pull-down control transistor T9 are substantially tuned off (while there is a leakage current, but the leakage current is too small).

The first pull-down module 13a has functions as follows: first, pulling up the potential of the pull-down node PD during the reset stage, so that the reset transistor T4 is turned on, and the pull-up node PU is discharged second, during a non-operation of the shift register cell, pulling down the pull-down node PD in an alternation manner, that is, the pull-down node PD is in an voltage-alternating state, so that aging and ineffectiveness of the first output pull-down transistor T2 resulting from right shift of transfer curve thereof due to a long time of a direct-current bias may be avoided, and lifetime of the shift register cell may be increased.

Several specific embodiments of the first pull-down module 13a will be described below in conjunction with FIG. 7 to FIG. 9.

In a first embodiment as shown in FIG. 7, the shift register cell further comprises a second clock signal input terminal CLKB, which is opposite from the first clock signal input terminal CLK. The first pull-down module 13a comprises a third pull-down control transistor T7 and a fourth pull-down control transistor T8, wherein the resistance of the fourth pull-down control transistor T8 is less than the resistance of the third pull-down control transistor T7, a gate and a drain of the third pull-down control transistor T7 are connected with the second clock signal input terminal CLKB, a source of the third pull-down control transistor T7 is connected with the second terminal b, a gate of the fourth pull-down control transistor T5 is connected with the second drive signal input terminal 14, a source of the fourth pull-down control transistor T8 is connected with the second low level input terminal, a drain of the fourth pull-down control transistor T8 is connected with the second terminal b, and the second terminal b is also connected with the third terminal c.

The first clock signal input terminal CLK being opposite from the second clock signal input terminal CLKB means that, when a high level is inputted from the first clock signal input terminal CLK, a low level is inputted from the second clock signal input terminal CLKB, and when a low level is inputted from the first clock signal input terminal CLK, a high level is inputted from the second clock signal input terminal CLKB.

Figure 10:
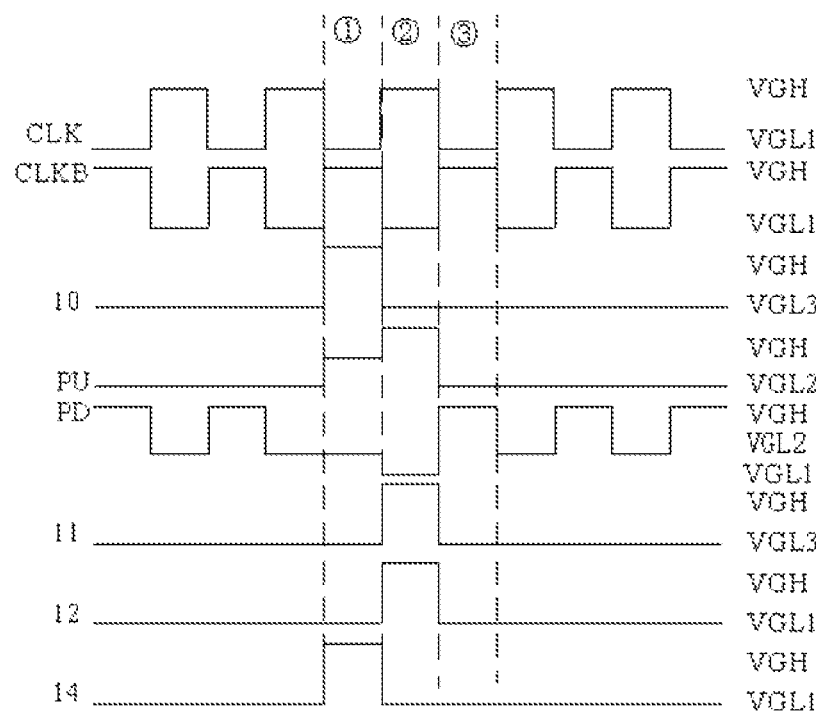
FIG. 10 is a timing diagram of signals of the shift register cell of the present invention during operation.

Operation principle of the shift register cell of the first embodiment of the present invention will be described below in detail in conjunction with FIG. 7 and FIG. 10.

During the pre-charging stage (stage①in FIG. 10), a high level VGH is inputted by the first drive signal input terminal 10, a high level VGH is inputted by the second drive signal input terminal 14, a first low level VGL1 is inputted by the first clock signal input terminal CLK, and a high level VGH is inputted by the second clock signal input terminal CLKB.

The switch transistor T3 is turned on to charge the pull-up node PU, so that the potential of the pull-up node PU is the high level VGH. At this time, the first pull-up transistor T1 and the second pull-up transistor T5 are turned on, and both of the first drive signal input terminal 11 and the second drive signal output terminal 12 output the first low level VGL1 inputted from the first clock signal input terminal CLK, thus the first pull-down control transistor T10 and the second pull-down control transistor T9 are substantially turned off. In this stage, both of the third pull-down control transistor T7 and the fourth pull-down control transistor T8 are turned on. As the resistance of the fourth pull-down control transistor T8 is less than the resistance of the third pull-down control transistor T7, the potential at the second terminal b of the pull-down unit approximates to the second low level VGL2. As the second terminal b is connected with the third terminal c, the potential of the third terminal c (i.e., the pull-down node PD) is the second low level VGL2. Therefore, the first output pull-down transistor T2 is completely turned off, the reset transistor T4 is substantially turned off, and charging process may be performed normally.

During the evaluation stage (stage②in FIG. 10), a low level is inputted by the first drive signal input terminal 10, a first low level VGL1 is inputted by the second drive signal input terminal 14, a high level VGH is inputted by the first clock signal input terminal CLK, and a first low level VGL1 is inputted by the second clock signal input terminal CLKB.

The potential of the pull-up node PU is coupled to be higher by the bootstrap capacitor C1, so that the first pull-up transistor T1 and the second pull-up transistor T5 are turned on, the first drive signal output terminal 11 and the second drive signal output terminal 12 can output the high level VGH, and the first pull-down control transistor T10 and the second pull-down control transistor T9 are turned on because the potentials of the gates thereof are the high level VGH output from the second drive signal output terminal 12, thus the third terminal c (i.e., the pull-down node PD) and the gate of the switch transistor T3 are pulled down to have the first low level VGL1, thereby the first output pull-down transistor T2 and the switch transistor T3 are completely turned off. During the evaluation stage, the third pull-down control transistor T7 and the fourth pull-down control transistor T8 are turned off, and as the second terminal b and the third terminal c of the pull-down unit are connected with each other, thus the potentials of the second terminal b and the third terminal c are the same with each other and both of them are the first low level VGL1, so that the reset transistor T4 is completely turned off. From this, it can be seen that, during the evaluation stage, all of the first output pull-down transistor T2, the switch transistor T3 and the reset transistor T4 are completely turned of and there is no leakage current, so that the potential of the pull-up node PU may be high to ensure the high level VGH output from the first drive signal output terminal 11 being enough high.

During the reset stage, a low level is inputted by the first drive signal input terminal 10, a low level is inputted by the second drive signal input terminal 14, a first low level VGL1 is inputted by the first clock signal input terminal CLK, and a high level VGH is in putted by the second clock signal input terminal CLKB.

The second drive signal output terminal 12 outputs a low level, the first pull-down control transistor T10 and the second pull-down control transistor T9 are turned off, and the switch transistor T3 is turned off the high level VGH is inputted from the second clock signal input terminal CLKB, the first low level VGL1 is inputted from the second drive signal input terminal 14, the third pull-down control transistor T7 is turned on, and the fourth pull-down control transistor T8 is turned off, thus the potential of the second terminal b is the high level VGH. As the second terminal b is connected with the third terminal c, thus the potential of the third terminal c is also the high level VGH, thereby all of the first output pull-down transistor T2, the second output pull-down transistor T6 and the reset transistor T4 are turned on, the pull-up node PU is discharged by the reset transistor T4, the first drive signal output terminal outputs the third low level VGL3, the second drive signal output terminal outputs the first low level VGL1.

During the non-operation stage, the third pull-down control transistor T7 is alternatively turned on and off, that is, the pull-down node PD is in an voltage-alternating state, so that aging and ineffectiveness of the first output pull-down transistor T2 resulting from right shift of transfer curve thereof due to a long time of a direct-current bias may be avoided, and lifetime of the shift register cell may be increased.

Figure 8:
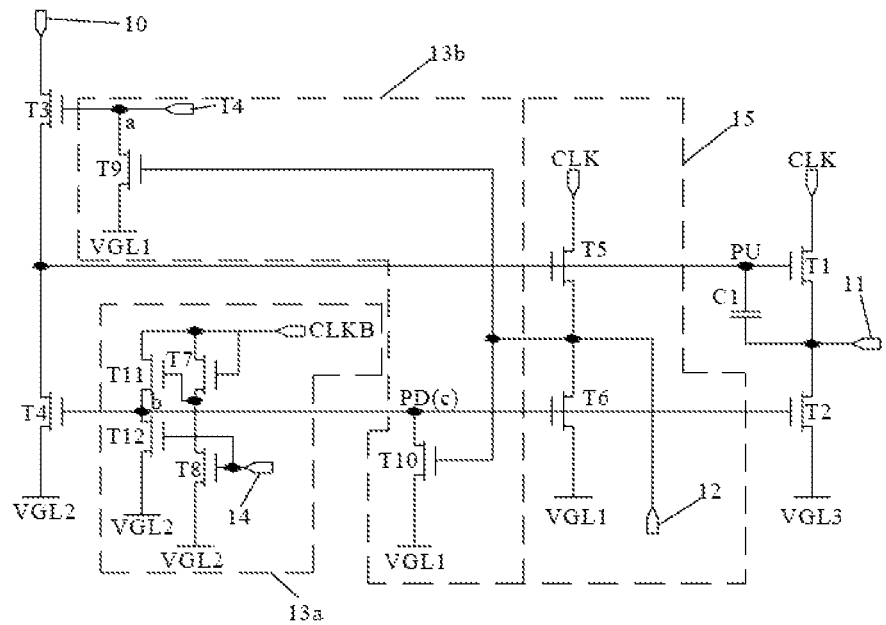
FIG. 8 is a circuit diagram of a third embodiment of the shift register cell of the present invention.

In a second embodiment as shown in FIG. 8, the first pull-down module 13a comprises a third pull-down control transistor T7, a fourth pull-down control transistor T5, a fifth pull-down control transistor T11 and a sixth pull-down control transistor T12, wherein the resistance of the fourth pull-down control transistor T8 is less than the resistance of the third pull-down control transistor T7, the resistance of the sixth pull-down control transistor T12 is less than the resistance of the fifth pull-down control transistor T11, a gate and a drain of the third pull-down control transistor T7 are connected with the second clock signal input terminal CLKB, a source of the third pull-down control transistor T7 is connected with a drain of the fourth pull-down control transistor T8, a gate of the fourth pull-down control transistor T8 is connected with the second drive signal input terminal 14, a source of the fourth pull-down control transistor T8 is connected with the second low level input terminal, a drain of the fifth pull-down control transistor T11 is connected with the second clock signal input terminal CLKB, a gate of the fifth pull-down control transistor T11 is connected with the drain of the fourth pull-down control transistor T8, a source of the fifth pull-down control transistor T11 is connected with the second terminal b of the pull-down unit, a gate of the sixth pull-down control transistor T12 is connected with the second drive signal input terminal, a source of the sixth pull-down control transistor T12 is connected with the second low level input terminal, a drain of the sixth pull-down control transistor T12 is connected with the second terminal b of the pull-down unit, and the second terminal b and the third terminal c of the pull-down unit are connected with each other.

In the present embodiment, structures and operation principles of the second pull-down module 13b and the second drive signal output module 15 are the same as those in the first embodiment respectively, thus only states of the first pull-down module 13a in operation stages and non-operation stages of the shift register cell are described here.

During the pre-charging stage, all of the third pull-down control transistor T7, the fourth pull-down control transistor T5, and the sixth pull-down control transistor T12 are turned on. As the resistance of the third pull-down control transistor T7 is larger than the resistance of the fourth pull-down control transistor T5, the potential of the gate of the fifth pull-down control transistor T11 approximates to the second low level VGL2, the fifth pull-down control transistor T11 is substantially turned off, and the potential of the drain of the sixth pull-down control transistor T12 (i.e., the second terminal b of the pull-down unit) is the second low level VGL2, thereby it can ensure that the first output pull-down transistor T2 is completely turned off during the pre-charging stage, and the pre-charging stage is in normal.

During the evaluation stage, all of the third pull-down control transistor T7, the fourth pull-down control transistor T5, the fifth pull-down control transistor T1 and the sixth pull-down control transistor T12 are turned off.

During the reset stage, the third pull-down control transistor T7 and the fifth pull-down control transistor T11 are turned on, the fourth pull-down control transistor T8 and the sixth pull-down control transistor T12 are tuned off, the potential of the second terminal b of the pull-down unit is a high level, thus the reset transistor T4 is turned on, and the pull-up node is discharged.

During the non-operation stage, the third pull-down control transistor T7 and the fifth pull-down control transistor T11 are alternatively turned on and off that is, the pull-down node PD is in an voltage-alternating state.

Figure 9:
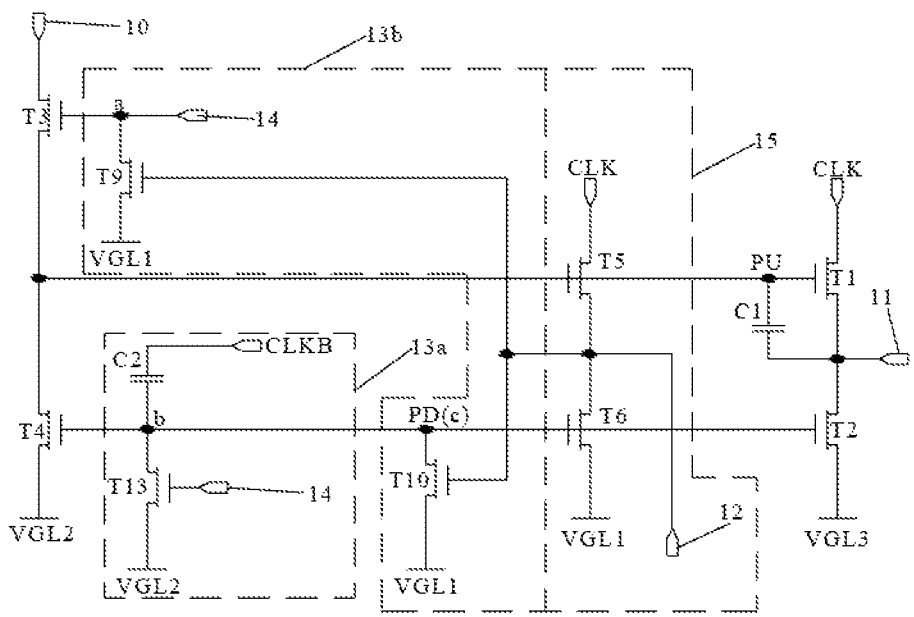
FIG. 9 is a circuit diagram of a fourth embodiment of the shift register cell of the present invention.

In order to further simplify the structure of a shift register cell, as shown in a third embodiment in FIG. 9, the first pull-down module 13a may comprise a seventh pull-down control transistor T13 and a pull-down capacitor C2, wherein one terminal of the pull-down capacitor C2 is connected with the second clock signal input terminal CLKB, the other terminal of the pull-down capacitor C2 is connected with the second terminal b of the pull-down unit, a gate of the seventh pull-down control transistor T13 is connected with the second drive signal input terminal 14, a source of the seventh pull-down control transistor T13 is connected with the second low level input terminal, a drain of the seventh pull-down control transistor T13 is connected with the second terminal b of the pull-down unit, and the second terminal b and the third terminal c of the pull-down unit are connected with each other.

During the pre-charging stage, the pull-down capacitor C2 is charged, the seventh pull-down control transistor T13 is turned on. As the resistance of the pull-down capacitor C2 is larger than the resistance of the seventh pull-down control transistor T13, the potential at the second terminal b of the pull-down unit approximates to the second low level VGL2.

During the evaluation stage, the seventh pull-down control transistor T13 is turned off and charging for the pull-down capacitor C2 is stopped.

During the reset stage, the seventh pull-down control transistor T13 is turned off and the pull-down capacitor C2 is charged, so that the potential at the second terminal b of the pull-down unit is the high level VGH, the reset transistor T4 is turned on, and the pull-up node PU is discharged.

During the non-operation stage, the seventh pull-down control transistor T13 is turned off and the pull-down capacitor C2 is alternatively charged and power-off thus the pull-down node PD is pulled down in an alternation manner.

In the shift register cell of the present invention, at least one of the first pull-up transistor T1, the first output pull-down transistor T2, the switch transistor T3 and the reset transistor T4 may be a depletion type transistor. Further, all of the first pull-up transistor T1, the first output pull-down transistor T2, the switch transistor T3 and the reset transistor T4 may be depletion type transistors. Advantages of a depletion type transistor have been described in the background art, and will not be repeated here.

In the embodiments of the present invention, all of the first pull-up transistor T1, the first output pull-down transistor T2, the switch transistor T3 and the reset transistor T4 are N-channel thin film transistors.

Figure 11:
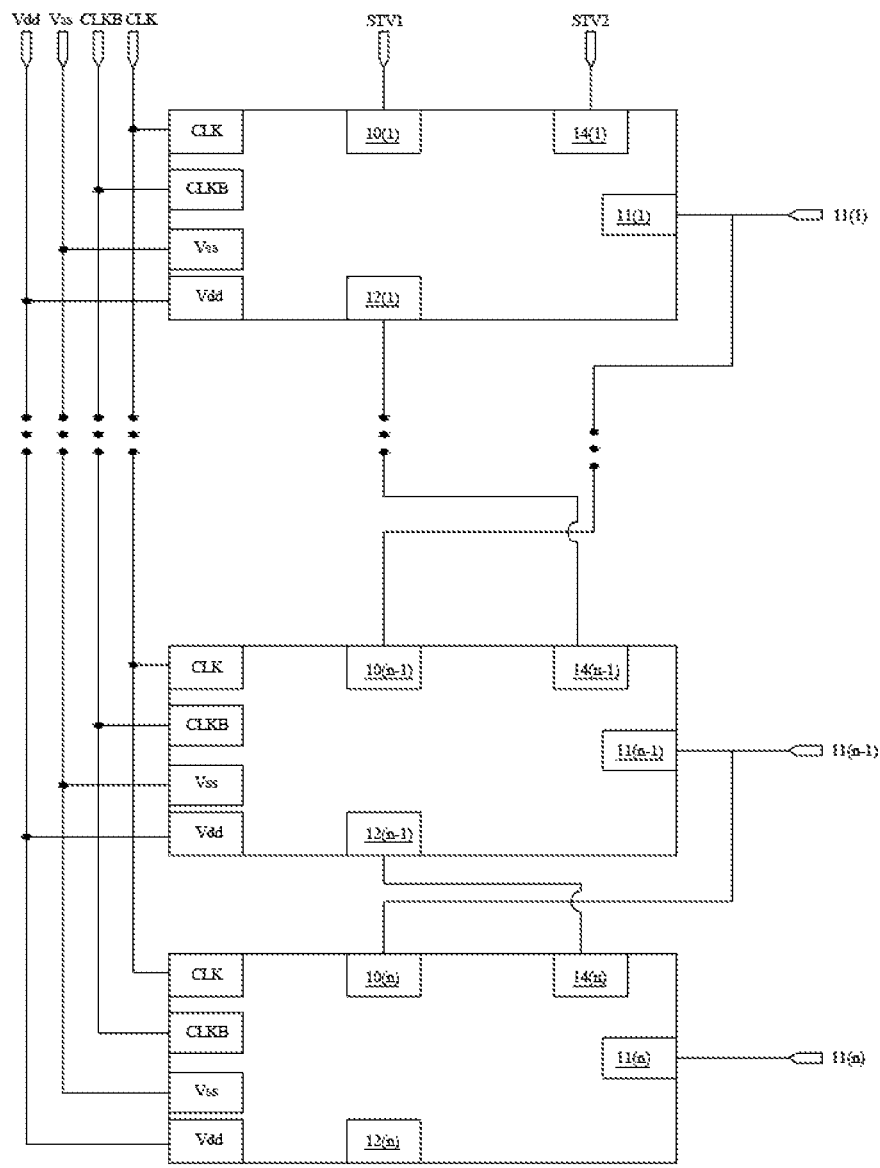
FIG. 11 is a diagram of a shift register of the present invention.

Another aspect of the present invention provides a shift register comprising multiple stages of shift register cells, which are above shift register cells provided by the present invention. As shown in FIG. 11 the first drive signal input terminal 10(n) of the shift register cell in a post-stage is connected with the first drive signal output terminal 11(n−1) of the shift register cell in a previous-stage, wherein n represents a natural number.

It should be understood that 10(1) represents the first drive signal input terminal of the shift register cell in a first stage, 11(1) represents the first drive signal output terminal of the shift register cell in the first stage, 10(n−1) represents the first drive signal input terminal of the shift register cell in a (n−1)$^{th}$ stage, 11(n−1) represents the first drive signal output terminal of the shift register cell in the (n−1)$^{th}$ stage, 10(n) represents the first drive signal input terminal of the shift register cell in a n$^{th}$ stage. 11(n) represents the first drive signal output terminal of the shift register cell in the n$^{th}$ stage, and $V_{dd}$ and $V_{ss}$ represent an anode and an cathode of a power source for supplying power to the shift register cells respectively.

When the shift register cell comprises a second drive signal output module, the second drive signal output terminal 12(n−1) of the shift register cell in an previous-stage is connected with the second drive signal input terminal 14(n) of the shift register cell in a post-stage.

In FIG. 11, 14(1) represents the second drive signal input terminal of the shift register cell in the first stage, 12(1) represents the second drive signal output terminal of the shift register cell in the first stage, 14(n-1) represents the second drive signal input terminal of the shift register cell in the $(n-1)^{th}$ stage, 12(n-1) represents the second drive signal output terminal of the shift register cell in the $(n-1)^{th}$ stage, 14(n) represents the second drive signal input terminal of the shift register cell in the $n^{th}$ stage, 12(n) represents the second drive signal output terminal of the shift register cell in the $n^{th}$ stage.

Depletion type transistors may be applied to the shift register of the present invention.

Another aspect of the present invention further provides a gate driver comprising above shift register.

Still another aspect of the present invention provides a display panel. The display panel comprises thin film transistors, data lines, gate lines and a gate driver electrically connected with the gate lines, wherein the gate driver is above gate driver provided by the present invention, and a drive signal output terminal of the gate driver is connected with the gate lines.

Like existing technology, the display panel may comprise a plurality of gate lines and data lines, and the gate lines and the data lines intersect with each other to form a plurality of pixel units, wherein each pixel unit is provided with a thin film transistor therein, the shift register cell of each stage in the shift register of the gate driver is connected with a corresponding gate line, and the high level VGH is provided to the gate line to turn on the thin film transistor.

In the display panel all of the first pull-up transistor T1, the first output pull-down transistor T2, the switch transistor T3 and the reset transistor T4 used by the shift register cell in the shift register of the gate driver may be depletion type transistors. Advantages of a depletion type transistor have been described in the background art, and will not be repeated here.

It should be understood that, the above implementations are only used to explain the principle of the present invention, but not to limit the present invention. Some of the technical features disclosed above may be omitted in embodiments of the present invention, so as to only solve part of technical problems of the prior art. Furthermore, the disclosed technical features may be combined in arbitrary manner. The persons skilled in the art can make various variations and modifications without departing from the spirit and scope of the present invention, and these variations and modifications are also considered to be within the protection scope of the present invention. The protection scope of the present invention should be defined by the claims.

The invention claimed is:

1. A shift register cell comprising a first drive signal input terminal, a first drive signal output terminal, a first clock signal input terminal, a first pull-up transistor, a first output pull-down transistor, a switch transistor, a reset transistor and a bootstrap capacitor, wherein a drain of the switch transistor is connected with the first drive signal input terminal, a drain of the first output pull-down transistor is connected with the first drive signal output terminal, one terminal of the bootstrap capacitor is connected with a gate of the first pull-up transistor, the other terminal of the bootstrap capacitor is connected with the first drive signal output terminal, the gate of the first pull-up transistor is connected with a source of the switch transistor, a drain of the first pull-up transistor is connected with the first clock signal input terminal, a source of the first pull-up transistor is connected with the first drive signal output terminal, and a drain of the reset transistor is connected with the source of the switch transistor, which is characterized in that:

the shift register cell further comprises a pull-down unit, wherein a first terminal of the pull-down unit is connected with a gate of the switch transistor, a second terminal of the pull-down unit is connected with a gate of the reset transistor, a third terminal of the pull-down unit is connected with a gate of the first output pull-down transistor, a source of the reset transistor is connected with a second low level input terminal capable of outputting a second low level, and a source of the first output pull-down transistor is connected with a third low level input terminal capable of outputting a third low level, during an evaluation stage, the pull-down unit outputs a first low level to the gate of the first output pull-down transistor, the gate of the switch transistor and the gate of the reset transistor, wherein difference between the first low level and the second low level is less than threshold voltage of the reset transistor, and difference between the first low level and the third low level is less than threshold voltage of the first output pull-down transistor.

2. The shift register cell of claim 1, wherein the pull-down unit comprises a first pull-down module and a second pull-down module, the first pull-down module is used for outputting the second low level to the second terminal and the third terminal during a pre-charging stage, wherein difference between the second low level and the third low level is less than threshold voltage of the first output pull-down transistor, the second pull-down module is used for outputting the first low level to the second terminal and the third terminal during the evaluation stage.

3. The shift register cell of claim 2, wherein the shift register cell comprises a second drive signal output terminal, which is synchronous with the first drive signal output terminal, and is capable of outputting a high level and the first low level, the second pull-down module comprises a first pull-down control transistor and a second drive signal input terminal, wherein a gate of the first pull-down control transistor is connected with the second drive signal output terminal, a source of the first pull-down control transistor is connected with the first low level input terminal, a drain of the first pull-down control transistor is connected with the second terminal and the third terminal, the second drive signal input terminal is synchronous with the first drive signal input terminal, is capable of being inputted a high level and the first low level, and is connected with the first terminal.

4. The shift register cell of claim 3, wherein the second pull-down module further comprises a second pull-down control transistor, wherein a gate of the second pull-down control transistor is connected with the second drive signal output terminal, a source of the second pull-down control transistor is connected with the first low level input terminal, and a drain of the second pull-down control transistor is connected with the first terminal.

5. The shift register cell of claim 4, wherein the shift register cell further comprises a second drive signal output module comprising a second pull-up transistor and a second output pull-down transistor, wherein a gate of the second pull-up transistor is connected with the gate of the first pull-up transistor, a drain of the second pull-up transistor is connected with the first clock signal input terminal, a source of the second pull-up transistor is connected with the second drive signal output terminal, a gate of the second output pull-down transistor is connected with the gate of the first output pull-down transistor, a source of the second output pull-down transistor is connected with the first low level input terminal, and a drain of the second output pull-down transistor is connected with the second drive signal output terminal.

6. The shift register cell of claim 4, wherein the shift register cell further comprises a second clock signal input terminal, which is opposite from the first clock signal input terminal, the first pull-down module comprises a third pull-down control transistor and a fourth pull-down control transistor, wherein the resistance of the fourth pull-down control transistor is less than the resistance of the third pull-down control transistor, a gate and a drain of the third pull-down control transistor are connected with the second clock signal input terminal, a source of the third pull-down control transistor is connected with the second terminal, a gate of the fourth pull-down control transistor is connected with the second drive signal input terminal, a source of the fourth pull-down control transistor is connected with the second low level input terminal, a drain of the fourth pull-down control transistor is connected with the second terminal, and the second terminal is also connected with the third terminal.

7. The shift register cell of claim 4, wherein the shift register cell further comprises a second clock signal input terminal, which is opposite from the first clock signal input terminal, the first pull-down module comprises a third pull-down control transistor, a fourth pull-down control transistor, a fifth pull-down control transistor and a sixth pull-down control transistor, wherein the resistance of the fourth pull-down control transistor is less than the resistance of the third pull-down control transistor, the resistance of the sixth pull-down control transistor is less than the resistance of the fifth pull-down control transistor, a gate and a drain of the third pull-down control transistor are connected with the second clock signal input terminal, a source of the third pull-down control transistor is connected with a drain of the fourth pull-down control transistor, a gate of the fourth pull-down control transistor is connected with the second drive signal input terminal, a source of the fourth pull-down control transistor is connected with the second low level input terminal, a drain of the fifth pull-down control transistor is connected with the second clock signal input terminal, a gate of the fifth pull-down control transistor is connected with the drain of the fourth pull-down control transistor, a source of the fifth pull-down control transistor is connected with the second terminal, a gate of the sixth pull-down control transistor is connected with the second drive signal input terminal, a source of the sixth pull-down control transistor is connected with the second low level input terminal, a drain of the sixth pull-down control transistor is connected with the second terminal, and the second terminal is also connected with the third terminal.

8. The shift register cell of claim 4, wherein the shift register cell further comprises a second clock signal input terminal, which is opposite from the first clock signal input terminal, the first pull-down module comprises a seventh pull-down control transistor and a pull-down capacitor, wherein the resistance of the pull-down capacitor is larger than the resistance of the seventh pull-down control transistor, one terminal of the pull-down capacitor is connected with the second clock signal input terminal, the other terminal of the pull-down capacitor is connected with the second terminal, a gate of the seventh pull-down control transistor is connected with the second drive signal input terminal, a source of the seventh pull-down control transistor is connected with the second low level input terminal, a drain of the seventh pull-down control transistor is connected with the second terminal, and the second terminal is connected with the third terminal.

9. The shift register cell of claim 3, wherein the shift register cell further comprises a second drive signal output module comprising a second pull-up transistor and a second output pull-down transistor, wherein a gate of the second pull-up transistor is connected with the gate of the first pull-up transistor, a drain of the second pull-up transistor is connected with the first clock signal input terminal, a source of the second pull-up transistor is connected with the second drive signal output terminal, a gate of the second output pull-down transistor is connected with the gate of the first output pull-down transistor, a source of the second output pull-down transistor is connected with the first low level input terminal, and a drain of the second output pull-down transistor is connected with the second drive signal output terminal.

10. The shift register cell of claim 3, wherein the shift register cell further comprises a second clock signal input terminal, which is opposite from the first clock signal input terminal, the first pull-down module comprises a third pull-down control transistor and a fourth pull-down control transistor, wherein the resistance of the fourth pull-down control transistor is less than the resistance of the third pull-down control transistor, a gate and a drain of the third pull-down control transistor are connected with the second clock signal input terminal, a source of the third pull-down control transistor is connected with the second terminal, a gate of the fourth pull-down control transistor is connected with the second drive signal input terminal, a source of the fourth pull-down control transistor is connected with the second low level input terminal, a drain of the fourth pull-down control transistor is connected with the second terminal, and the second terminal is also connected with the third terminal.

11. The shift register cell of claim 3, wherein the shift register cell further comprises a second clock signal input terminal, which is opposite from the first clock signal input terminal, the first pull-down module comprises a third pull-down control transistor, a fourth pull-down control transistor, a fifth pull-down control transistor and a sixth pull-down control transistor, wherein the resistance of the fourth pull-down control transistor is less than the resistance of the third pull-down control transistor, the resistance of the sixth pull-down control transistor is less than the resistance of the fifth pull-down control transistor, a gate and a drain of the third pull-down control transistor are connected with the second clock signal input terminal, a source of the third pull-down control transistor is connected with a drain of the fourth pull-down control transistor, a gate of the fourth pull-down control transistor is connected with the second drive signal input terminal, a source of the fourth pull-down control transistor is connected with the second low level input terminal, a drain of the fifth pull-down control transistor is connected with the second clock signal input terminal, a gate of the fifth pull-down control transistor is connected with the drain of the fourth pull-down control transistor, a source of the fifth pull-down control transistor is connected with the second terminal, a gate of the sixth pull-down control transistor is connected with the second drive signal input terminal, a source of the sixth pull-down control transistor is connected with the second low level input terminal, a drain of the sixth pull-down control transistor is connected with the second terminal, and the second terminal is also connected with the third terminal.

12. The shift register cell of claim 11, wherein all of the first pull-up transistor, the first output pull-down transistor, the switch transistor and the reset transistor are N-channel thin film transistors.

13. The shift register cell of claim 3, wherein the shift register cell further comprises a second clock signal input terminal, which is opposite from the first clock signal input terminal, the first pull-down module comprises a seventh pull-down control transistor and a pull-down capacitor, wherein the resistance of the pull-down capacitor is larger than the resistance of the seventh pull-down control transistor, one terminal of the pull-down capacitor is connected with the second clock signal input terminal, the other terminal of the pull-down capacitor is connected with the second terminal, a gate of the seventh pull-down control transistor is connected with the second drive signal input terminal, a source of the seventh pull-down control transistor is connected with the second low level input terminal, a drain of the seventh pull-down control transistor is connected with the second terminal, and the second terminal is connected with the third terminal.

14. The shift register cell of claim 1, wherein at least one of the first pull-up transistor, the first output pull-down transistor, the switch transistor and the reset transistor is a depletion type transistor.

15. A shift register comprising multiple stages of shift register cells, each of which is the register cell of claim 1, wherein the first drive signal input terminal of the shift register cell in a post-stage is connected with the first drive signal output terminal of the shift register cell in a previous-stage.

16. A display panel comprising thin film transistors, data lines, gate lines and a gate driver electrically connected with the gate lines, wherein the gate driver comprises the shift register of claim 15, and a first drive signal output terminal of a shift register cell in a shift register of the gate driver is connected with the gate line.

* * * * *